(12) United States Patent
Chiu

(10) Patent No.: US 7,956,374 B2
(45) Date of Patent: Jun. 7, 2011

(54) SEMICONDUCTOR LIGHT-EMITTING DEVICE

(75) Inventor: Shu-Wei Chiu, Hsinchu County (TW)

(73) Assignee: HUGA Optotech Inc., Taichung (TW)

( * ) Notice: Subject to any disclaimer, the term of this patent is extended or adjusted under 35 U.S.C. 154(b) by 291 days.

(21) Appl. No.: 12/128,394

(22) Filed: May 28, 2008

(65) Prior Publication Data
US 2009/0057702 A1    Mar. 5, 2009

(30) Foreign Application Priority Data

Aug. 31, 2007  (TW) ............................... 96132464 A

(51) Int. Cl.
  *H01L 33/00*  (2010.01)
(52) U.S. Cl. .................... 257/98; 257/99; 257/E33.061; 257/E33.068
(58) Field of Classification Search ............... 257/98, 257/99, E33.061, E33.068
  See application file for complete search history.

(56) References Cited

U.S. PATENT DOCUMENTS

| | | | |
|---|---|---|---|
| 2005/0139847 A1 | 6/2005 | Kim et al. | |
| 2005/0212098 A1 | 9/2005 | Bogner et al. | |
| 2006/0081858 A1* | 4/2006 | Lin et al. | 257/85 |
| 2009/0045416 A1* | 2/2009 | Bierhuizen et al. | 257/88 |

FOREIGN PATENT DOCUMENTS

JP  2001-307506  11/2001

OTHER PUBLICATIONS

"First Office Action of China Counterpart Application," issued on Sep. 11, 2009, p1-p8, in which the listed references were cited.
"Office Action of Taiwan Counterpart Application", issued on Jan. 19, 2011, p1-p5, in which the listed reference was cited.

* cited by examiner

*Primary Examiner* — Minh-Loan T Tran
(74) *Attorney, Agent, or Firm* — Jianq Chyun IP Office

(57) ABSTRACT

The invention discloses a semiconductor light-emitting device. The semiconductor light-emitting device according to the invention includes a substrate, a multi-layer structure, at least one electrode structure, and a light reflector. The substrate has an upper surface. The multi-layer structure is formed on the upper surface of the substrate. The multi-layer structure includes a light-emitting region and at least one semiconductor material layer. The multi-layer structure also has a top surface. The at least one electrode structure is formed on the top surface of the multi-layer structure. The light reflector is formed on the top surface of the multi-layer structure.

6 Claims, 6 Drawing Sheets

SEMICONDUCTOR LIGHT-EMITTING DEVICE

BACKGROUND OF THE INVENTION

1. Field of the invention

The present invention relates to a semiconductor light-emitting device and, more particularly, to a semiconductor light-emitting device with high light-emitting efficiency and better color rendering property.

2. Description of the prior art

The so-called "white-light" usually refers to a mixed light of multiple light sources with different colors. The white-light that is visible for human beings includes at least two colored lights with at least two wavelengths. For example, mixing blue-light and yellow-light can get a two-wavelength white light. Mixing blue-light, green-light, and red-light can get a three-wavelength white light.

Nowadays, no matter it is a household illuminating apparatus, such as a fluorescent lamp, a U-shaped electricity-consuming bulb, a small flashlight, or an illuminating apparatus inside cars, air crafts or ships, light emitted from such illuminating apparatus belongs to a three-wavelength white light. In addition, the back-light source of the TFT-LCD also belongs to a three-wavelength white light. This proves that white light-emitting modules have taken a considerably large proportion in the market of illuminating apparatus.

White light-emitting diodes (WLED) in the prior art mainly include two types. The first type includes multiple LED chips, and white light is generated by adjusting the current passing through each single-colored LED chip. Besides, the first type can also be divided into a three-wavelength WLED using a red-light LED chip, a blue-light LED chip and a green-light LED chip; and another two-wavelength WLED using a yellow-light LED chip and a blue-light LED chip. Although the first type of WLED has higher light-emitting efficiency, fabrication cost is higher due to the use of multiple single-colored LED chips.

The second type uses a blue-light LED chip combined with a yellow inorganic fluorescent powder (or a yellow organic fluorescent dye) to emit white light. The blue light emitted from a blue-light LED chip has a wavelength between 440 nm and 490 nm. After being illuminated by the blue light, the yellow inorganic fluorescent powder can emit yellow-colored fluorescence which is mixed with the blue light to generate the white light. Compared to the first type of WLED, the second type of WLED is easier to be fabricated and is cheaper, thus present commercially available WLEDs mostly belong to the second type of WLED.

However, because the second type of WLED has lower light-emitting efficiency and is a two-wavelength WLED (mixture of a blue light and a yellow light only), its performances on the color rendering property and the color temperature are worse than those of a three-wavelength WLED. Therefore, the existing drawbacks of the second type of WLED need to be improved.

Therefore, the main scope of the invention is to provide a semiconductor light-emitting device with high light-emitting efficiency and better color rendering property.

SUMMARY OF THE INVENTION

One scope of the invention is to provide a semiconductor light-emitting device.

According to an embodiment of the invention, the semiconductor light-emitting device includes a substrate, a multi-layer structure, at least one electrode structure, and a light reflector.

The substrate has an upper surface. The multi-layer structure is formed on the tipper surface of the substrate and includes at least one semiconductor material layer and a light-emitting region. The multi-layer structure also includes a top-most surface. The at least one electrode structure is formed on the top-most surface of the multi-layer structure. The light reflector is formed on the top-most surface of the multi-layer structure.

According to another embodiment of the invention, the semiconductor light-emitting device includes a substrate, a multi-layer structure, a light reflector, and at least one electrode structure.

The substrate has an upper surface and a lower surface. The multi-layer structure is formed on the upper surface of the substrate and includes at least one semiconductor material layer and a light-emitting region. The multi-layer structure also includes a top-most surface. The light reflector is formed on the lower surface of the multi-layer structure. The at least one electrode structure is formed over the top-most surface of the multi-layer structure.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1:
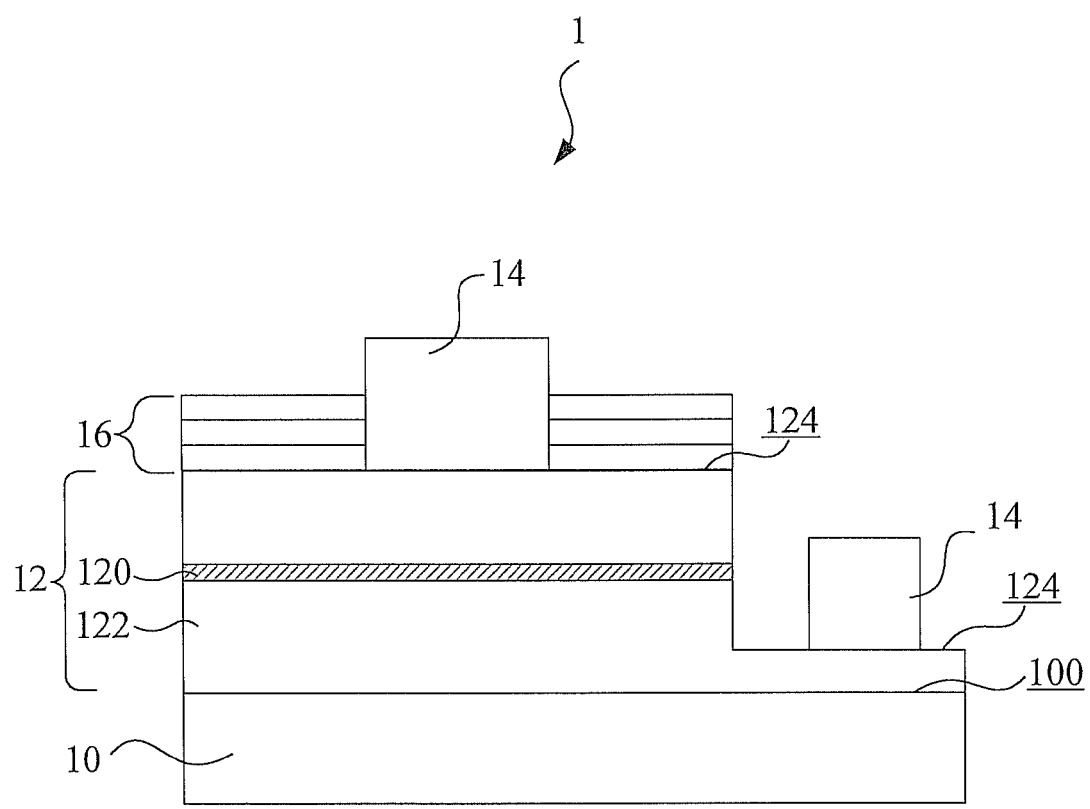
FIG. 1 is a sectional view of a semiconductor light-emitting device according to an embodiment of the invention.

Please refer to FIG. 1. FIG. 1 is a sectional view of a semiconductor light-emitting device 1 according to an embodiment of the invention.

In the embodiment, the semiconductor light-emitting device 1 takes a light-emitting diode for an example, but not limited therein. The light emitted by the light-emitting diode can be combined with inorganic fluorescent powders or dies to emit white light.

As shown in FIG. 1, the semiconductor light-emitting device 1 includes a substrate 10, a multi-layer structure 12, at least one electrode structure 14, and a light reflector 16.

The substrate 10 can be $SiO_2$, Si, Ge, GaN, AlN, sapphire, spinnel, SiC, ZnO, MgO, GaAs, GaP, $Al_2O_3$, $LiGaO_2$, $LiAlO_2$, or $MgAl_2O_4$.

The substrate 10 has an upper surface 100. The multi-layer structure 12 is formed on the upper surface 100 of the substrate 10. The multi-layer structure 12 includes at least one semiconductor material layer 122 and a light-emitting region 120.

In one embodiment, the at least one semiconductor material layer 122 can be formed of an II-VI group compound or an III-V group compound.

The multi-layer structure 12 also includes a top-most surface 124. The at least one electrode structure 14 is formed on the top-most surface 124 of the multi-layer structure 12. The light reflector 16 is formed on the top-most surface 124 of the multi-layer structure 12.

Figure 2:
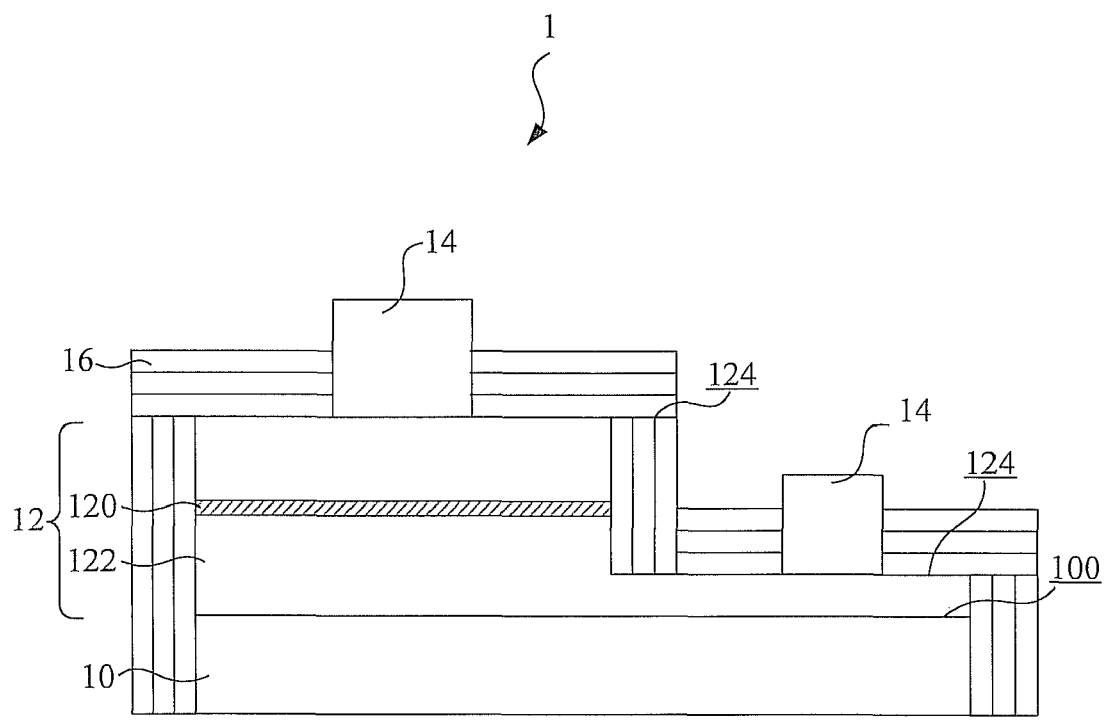
FIG. 2 is a sectional view of a semiconductor light-emitting device in another embodiment extended form the semiconductor light-emitting device in FIG. 1.

Please refer to FIG. 2. FIG. 2 is a sectional view of a semiconductor light-emitting device 1 in another embodiment extended from the semiconductor light-emitting device 1 in FIG. 1.

As shown in FIG. 2, besides being formed on the top-most surface 124 of the multi-layer structure 12, the light reflector 16 can be formed on the side surface of the multi-layer structure 12 and on the side surface of the substrate 10.

In one embodiment, the light reflector 16 can be formed on the top-most surface 124 of the multi-layer structure 12, or formed on the top-most surface 124, on the side surface of the multi-layer structure 12 and on the side surface of the substrate 10 together in a way of coating or adhesion.

In one embodiment, the light reflector 16 can be formed by alternate stack of at least one material layer with a high refractive index and at least one material layer with a low refractive index.

For example, the at least one material layer with a high refractive index can be formed of $Si_3N_4$, $TiO_2$, $Ta_2O_5$, $Nb_2O_5$, $CeO_2$ or ZnS. Alternately, the at least one material layer with a high refractive index can be formed of a combination of any other two compounds mentioned above. In addition, the at least one material layer with a low refractive index can be formed of $SiO_2$ and/or $MgF_2$.

Figure 3:
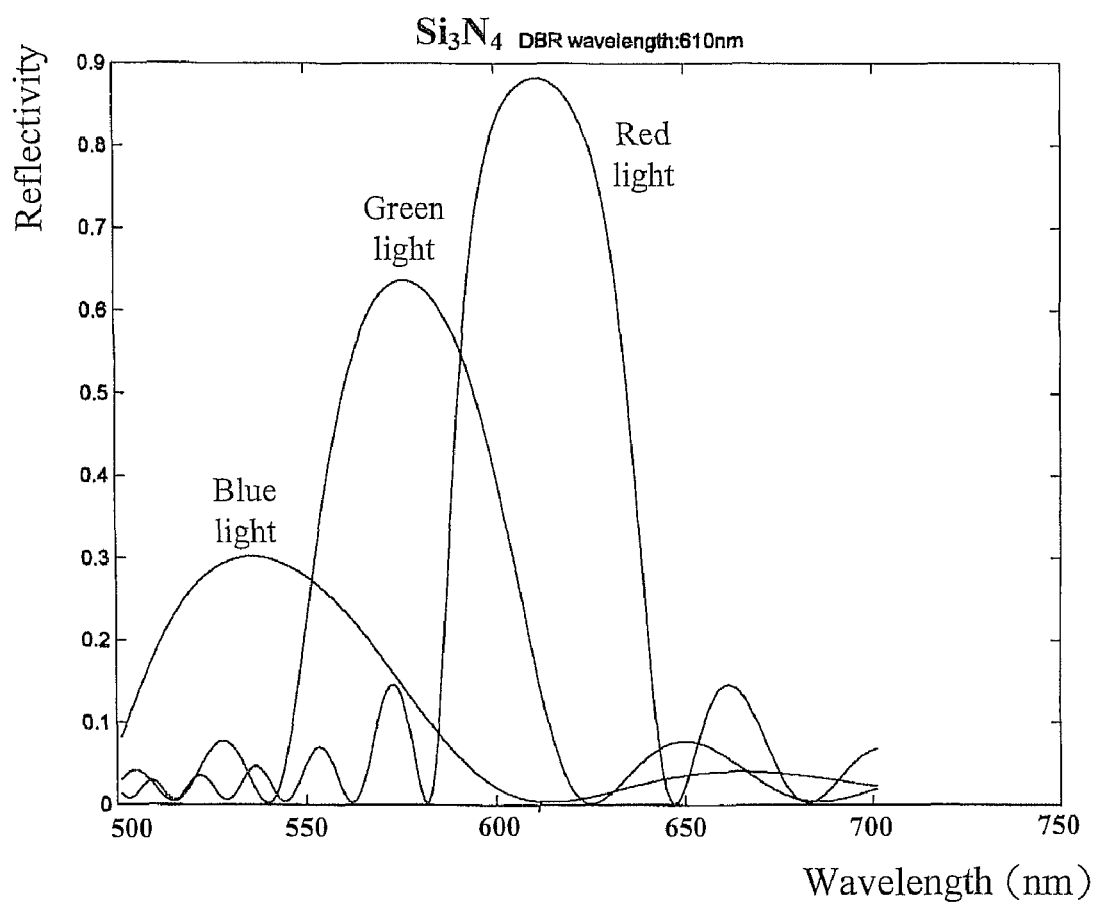
FIG. 3 is a reflectivity spectrum of a semiconductor light-emitting device according to the invention with respect to lights of different colors.

For example, the light reflector 16 can be formed of $Si_3N_4$ (refractive index is 1.89) and $SiO_2$ (refractive index is 1.45). Please refer to FIG. 3. FIG. 3 is a reflectivity spectrum of a semiconductor light-emitting device 1 according to the invention with respect to lights of different colors.

As shown in FIG. 3, if the light reflector 16 is formed of $Si_3N_4$ and $SiO_2$, changing the number of pairs of the light reflector 16 can get the required reflectivity with respect to lights of different colors. In one embodiment, as shown in FIG. 3, the light reflector 16 has a reflectivity close to 0.9 with respect to a red light.

In another embodiment, the light reflector 16 can be a reflector assembly. The reflector assembly can be formed of one or at least two of a blue-light reflector 16, a green-light reflector 16 and a red-light reflector 16.

The selection among the blue-light reflector 16, the green-light reflector 16 or the red-light reflector 16 can be determined by practical applications. By controlling the thickness or the number of pairs of the light reflector 16, the optimum wavelength and reflectivity of the light incident to the light reflector 16 can be controlled. Theoretically, the thickness value of the light reflector 16 is substantially equal to N λ/4 nm, where N is an odd number, λ is the wavelength of the light.

Figure 4:
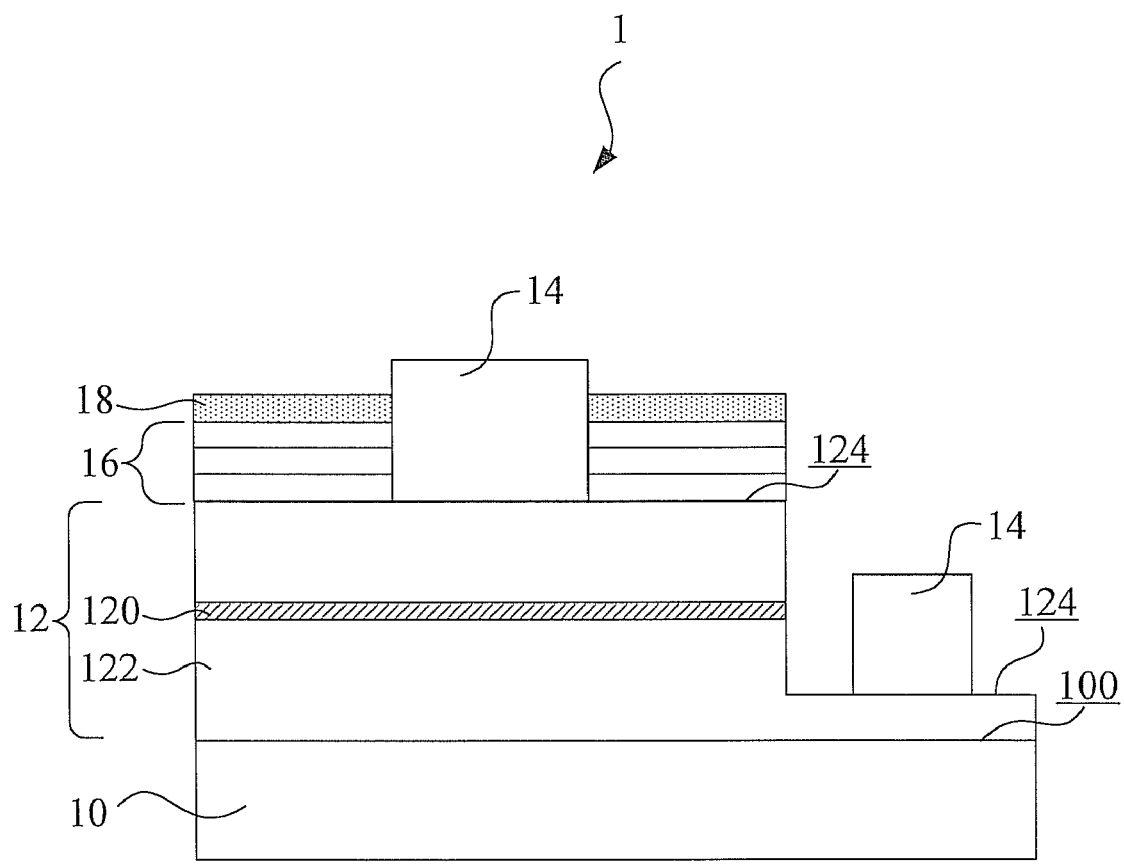
FIG. 4 is a sectional view of a semiconductor light-emitting device according to another embodiment of the invention.

Please refer to FIG. 4. FIG. 4 is a sectional view of a semiconductor light-emitting device 1 according to another embodiment of the invention. As shown in FIG. 4, the semiconductor light-emitting device 1 further includes a fluorescent layer 18 formed on the light reflector 16.

According to the Stoke theory, the excited efficiency of fluorescent powders is relevant to the type of exciting light and the wavelength difference of light sources. Take UV-based exciting light as an example, blue light has the best exciting efficiency, red light has the worst exciting efficiency, and green light has the intermediate exciting efficiency.

If being excited by the blue-light, the green-light has efficiency much better than the red-light. Thus, the reflectivity can be adjusted freely according to the light-emitting efficiency in designing the reflector assembly. For example, the reflectivity of the red-light can be adjusted to 100%, the reflectivity of the green-liglit can be adjusted to 70%, and the reflectivity of the blue-light can be adjusted to 50%. Consequently, a WLED of high efficiency and high color rendering property can be realized after the package of fluorescent powders.

The semiconductor light-emitting device 1 according to the invention (e.g. a WLED) certainly increases the light-emitting efficiency and the color rendering property of the semiconductor light-emitting device 1 after the package of fluorescent powders and the assistance of the reflector assembly. In particular, to compensate the outputting strength of red-light, the semiconductor light-emitting device 1 according to the invention can enhance the light-emitting efficiency and color rendering property thereof by changing the number of pairs of the light reflector 16 instead of increasing the quantity of fluorescent powders.

Figure 5:
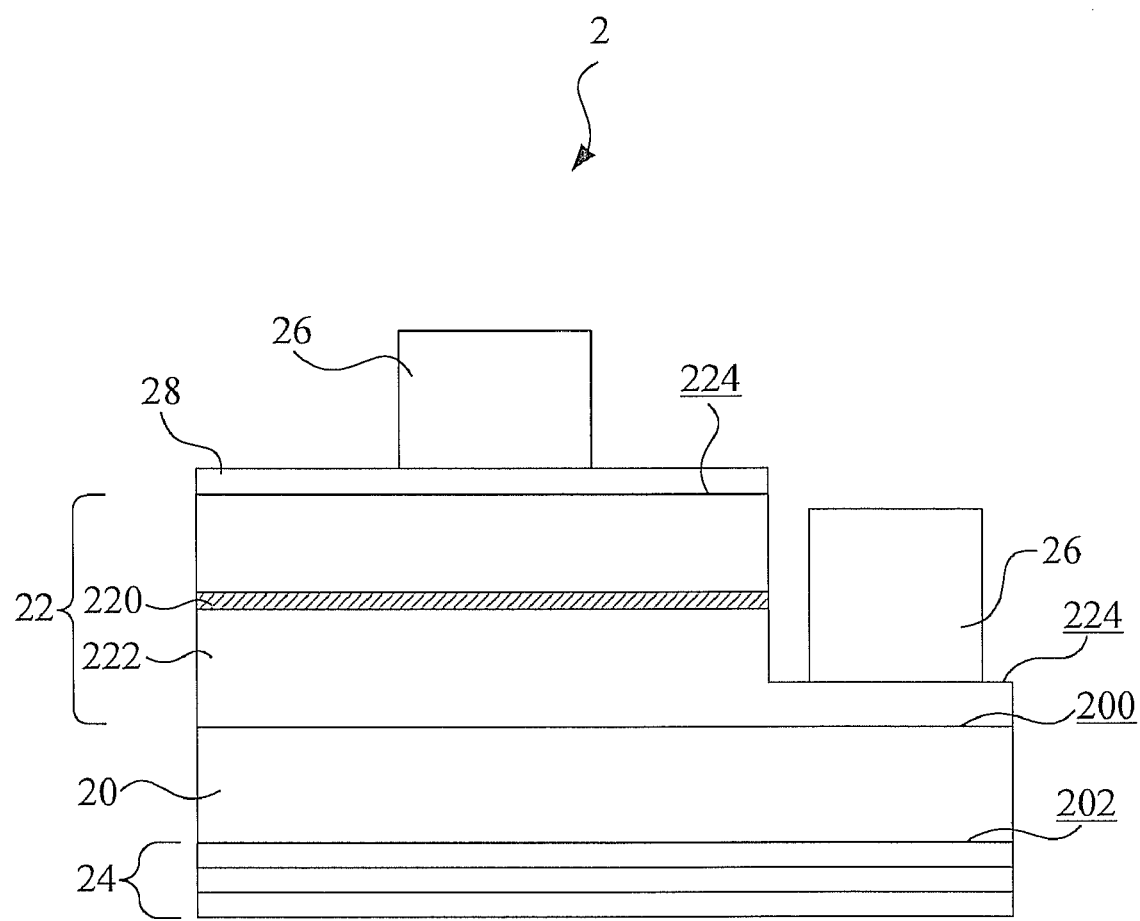
FIG. 5 is a sectional view of a semiconductor light-emitting device according to another embodiment of the invention.

Please refer to FIG. 5. FIG. 5 is a sectional view of a semiconductor light-emitting device 2 according to another embodiment of the invention.

As shown in FIG. 5, the semiconductor light-emitting device 2 includes a substrate 20, a multi-layer structure 22, a light reflector 24, and at least one electrode structure 26. The substrate 20 has an upper surface 200 and a lower surface 202. The multi-layer structure 22 is formed on the upper surface 200 of the substrate 20 and includes at least one semiconductor material layer 222 and a light-emitting region 220. The multi-layer structure 22 also includes a top-most surface 224. The light reflector 24 is formed on the lower surface 202 of the multi-layer structure 22. The at least one electrode structure 26 is formed over the top-most surface 224 of the multi-layer structure 22. In practical applications, the semiconductor light-emitting device 2 can further include a reflective layer 28 formed on the top-most surface 224 of the multi-layer structure 22.

Figure 6:
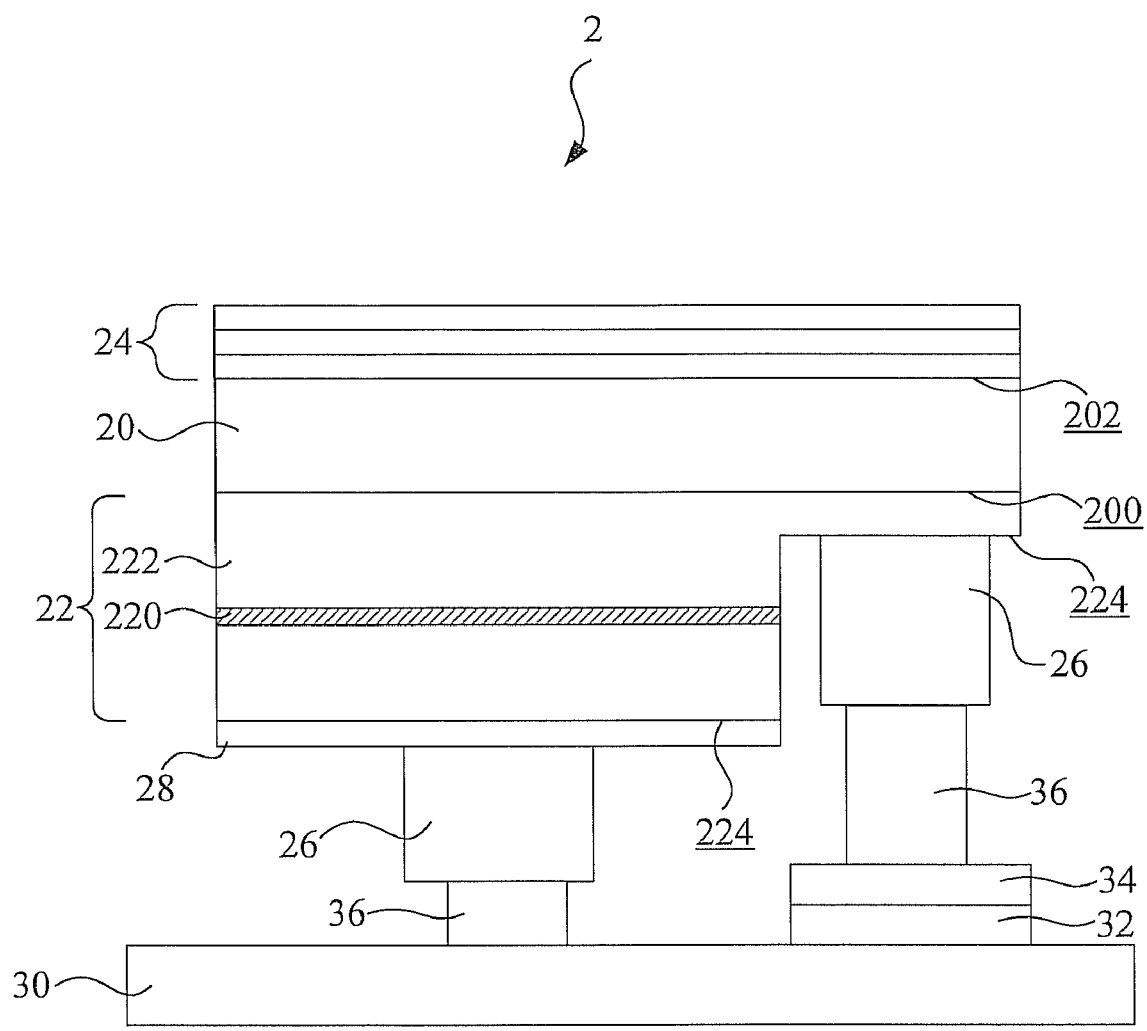
FIG. 6 is a sectional view of a flip-chip based light-emitting diode.

In one embodiment, the semiconductor light-emitting device 2 can be applied to a flip-chip based light-emitting diode. Please refer to FIG. 6. FIG. 6 is a sectional view of a flip-chip based light-emitting diode.

Besides the semiconductor light-emitting device 2 in FIG. 5, the flip-chip based light-emitting diode also includes a heat-conducting substrate 30. An insulating layer 32 is formed on the heat-conducting substrate 30, and a circuit layer 34 is formed on the insulating layer 32. As shown in FIG. 6, the flip-chip based light-emitting diode is realized by reversing the semiconductor light-emitting device 2 in FIG. 5 to bond to the heat-conducting substrate 30.

The at least one electrode structure 26 can be electrically connected to the heat-conducting substrate 30 and the circuit layer 34 via at least one bonding layer 36. The bonding layer 36 can be made of metal, but not limited therein.

In one embodiment, the light reflector 24 can be formed by alternate stack of at least one material layer with a high refractive index and at least one material layer with a low refractive index. The materials are mentioned above and will not be repeated herein.

In another embodiment, the light reflector 24 can be a reflector assembly. Similarly, the elements of the reflector assembly are mentioned above and will not be repeated herein.

Compared to the prior art, the semiconductor light-emitting device according to the invention (e.g. a WLED) can increase the light-emitting efficiency and improve the color rendering property thereof by using the light reflector.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A semiconductor light-emitting device, comprising:
a substrate having an upper surface;
a multi-layer structure formed on the upper surface of the substrate and comprising at least one semiconductor material layer and a light-emitting region, the multi-layer structure comprising a top-most surface;
at least one electrode structure formed on the top-most surface of the multi-layer structure;
a light reflector formed on the top-most surface of the multi-layer structure; and
a fluorescent layer formed on the light reflector, wherein the light reflector is a reflector assembly and is comprised of at least two selected from the group consisting of a blue-light reflector, a green-light reflector and a red-light reflector.

2. The semiconductor light-emitting device of claim 1, wherein the light reflector is also formed on a side surface of the multi-layer structure and/or on a side surface of the substrate.

3. The semiconductor light-emitting device of claim 2, wherein the light reflector is formed by alternate stack of at least one material layer with a high refractive index and at least one material layer with a low refractive index.

4. The semiconductor light-emitting device of claim 3, wherein the at least one material layer with a high refractive index is formed of one or two selected from the group consisting of $Si_3N_4$, $Ta_2O_5$, $Ta_2O_5$, $Nb_2O_5$, $CeO_2$ and $ZnS$, the at least one material layer with a low refractive index is formed of $SiO_2$ and/or $MgF_2$.

5. The semiconductor light-emitting device of claim 1, wherein the at least one semiconductor material layer is formed of a II-VI group compound or a III-V group compound.

6. The semiconductor light-emitting device of claim 1, wherein the substrate is formed of a material selected from the group consisting of $SiO_2$, Si, Ge, GaN, GaAs, GaP, AlN, sapphire, spinnel, $Al_2O_3$, SiC, ZnO, MgO, $LiGaO_2$, $LiAlO_2$, and $MgAl_2O_4$.

* * * * *